United States Patent
Yin et al.

(10) Patent No.: US 8,723,181 B2
(45) Date of Patent: May 13, 2014

(54) STACKED TRANSISTORS AND ELECTRONIC DEVICES INCLUDING THE SAME

(75) Inventors: Huaxiang Yin, Yongin-si (KR); Takashi Noguchi, Seongnam-si (KR); Wenxu Xianyu, Yongin-si (KR); Kyung-bae Park, Seoul (KR)

(73) Assignee: Samsung Electronics Co., Ltd., Gyeonggi-Do (KR)

(*) Notice: Subject to any disclaimer, the term of this patent is extended or adjusted under 35 U.S.C. 154(b) by 653 days.

(21) Appl. No.: 12/662,272

(22) Filed: Apr. 8, 2010

(65) Prior Publication Data

US 2010/0193797 A1    Aug. 5, 2010

Related U.S. Application Data

(63) Continuation of application No. 11/283,874, filed on Nov. 22, 2005, now Pat. No. 7,723,168.

(30) Foreign Application Priority Data

Dec. 17, 2004 (KR) ........................ 10-2004-0108031

(51) Int. Cl.
    *H01L 29/10* (2006.01)
(52) U.S. Cl.
    USPC ..................... 257/67; 257/E21.661; 438/279
(58) Field of Classification Search
    USPC .............. 438/153, 279; 257/67, 69, 351, 369, 257/401, E21.614, E21.661, E27.1
    See application file for complete search history.

(56) References Cited

U.S. PATENT DOCUMENTS

| | | | |
|---|---|---|---|
| 4,609,407 A | | 9/1986 | Masao et al. |
| 6,022,766 A | * | 2/2000 | Chen et al. ................ 438/152 |
| 6,271,542 B1 | | 8/2001 | Emma et al. |
| 6,515,511 B2 | * | 2/2003 | Sugibayashi et al. ........... 326/41 |
| 6,528,397 B1 | | 3/2003 | Taketomi et al. |
| 6,566,711 B1 | | 5/2003 | Yamazaki et al. |
| 6,620,659 B2 | | 9/2003 | Emmma et al. |
| 6,756,258 B2 | | 6/2004 | Zhang et al. |
| 6,911,675 B2 | * | 6/2005 | Kato et al. ....................... 257/86 |
| 2002/0021402 A1 | | 2/2002 | Hirabayashi et al. |
| 2002/0024102 A1 | | 2/2002 | Lee et al. |
| 2003/0096460 A1 | | 5/2003 | Nakajima et al. |
| 2003/0197007 A1 | | 10/2003 | Kim et al. |
| 2004/0214425 A1 | | 10/2004 | Lin et al. |
| 2004/0219722 A1 | | 11/2004 | Pham et al. |

* cited by examiner

*Primary Examiner* — David Vu
(74) *Attorney, Agent, or Firm* — Harness, Dickey & Pierce, P.L.C.

(57) ABSTRACT

Stacked transistors and electronic devices including the stacked transistors. An electronic device includes a substrate, a first transistor on the substrate and including a first active layer, a first gate, and a first gate insulating layer between the first active layer and the first gate, a first metal line spaced apart from the first gate on the substrate, a first insulating layer covering the first transistor and the first metal line, and a second transistor on the first insulating layer between the first transistor and the first metal line, and including a second active layer, a second gate, and a second gate insulating layer between the second active layer and the second gate.

17 Claims, 7 Drawing Sheets

STACKED TRANSISTORS AND ELECTRONIC DEVICES INCLUDING THE SAME

CROSS-REFERENCE TO RELATED PATENT APPLICATIONS

This continuation application claims priority under 35 U.S.C. §120 to application Ser. No. 11/283,874, filed Nov. 22, 2005 now U.S. Pat. No. 7,723,168, which claims benefit of Korean Patent Application No. 10-2004-0108031, filed on Dec. 17, 2004, in the Korean Intellectual Property Office (KIPO), the entire contents of which are incorporated herein by reference.

BACKGROUND

1. Field

The present disclosure relates to a method of manufacturing a high mobility polycrystalline Si film and a method of manufacturing a stacked transistor using the polycrystalline Si film.

2. Description of the Related Art

Polycrystalline Si, or "poly-Si", is widely used in devices such as flat panel displays and solar cells, since poly-Si has greater mobility than a-Si (amorphous Si). Generally, polycrystalline Si electronic devices are formed on a substrate that has a high resistance to heat. However, recently, methods of manufacturing polycrystalline Si electronic devices on plastic substrates have been investigated. To avoid damaging the plastic, low temperature processes are needed to form these polycrystalline Si electronic devices. The low temperature is required not only to prevent thermal impact to the substrate, but also to reduce process defects caused by the conventional high temperature process. Plastic substrates for flat display devices have been studied, since plastic is flexible, light, and strong.

Poly-Si thin film transistors (TFTs) are known as devices that can be formed on a plastic substrate meeting the requirements. However, the poly-Si TFTs must be manufactured at a low temperature, to protect the plastic substrate.

Recently, an S3 static random access memory (SRAM) in a three dimensional structure has been developed, using a stacked transistor structure.

The size of a conventional SRAM cell is 80-90 F2 (Neature size). However, the size of a single stack of the S3 SRAM cell in a three-dimensional structure is 46 F2, and the size of a double stack is 25 F2, which are ½-⅓ of the conventional sizes. This increases the versatility of SRAM, by increasing the capacity while maintaining the inherent characteristics such as low stand-by current and high speed. The attempts to reduce chip size by manufacturing semiconductor devices in three dimensional structures continue. However, there is a need to develop techniques to simplify manufacturing processes and reduce cost.

SUMMARY

Example embodiments may provide a method of manufacturing a polycrystalline Si film having high mobility, and a method of manufacturing a stacked transistor using the polycrystalline Si film. Example embodiments may provide stacked transistors and electronic device including the stacked transistors.

According to an aspect of the present invention, there may be provided a method of manufacturing a polycrystalline Si film, the method comprising: preparing an insulating substrate on which is formed a transistor that includes a poly-Si active layer, a gate insulating layer, and a gate, sequentially formed; forming an interconnection metal line at a predetermined distance from the gate; forming an insulating layer that covers the transistor and the interconnection metal line; forming an amorphous silicon layer on the insulating layer; and annealing the amorphous silicon layer. The annealing of the amorphous silicon layer can include forming a polycrystalline Si film crystallized in lateral directions on the insulating layer between the transistor and the interconnection metal line by annealing the amorphous silicon layer.

According to another aspect of the present invention, there is provided a method of manufacturing a stacked transistor, the method comprising: preparing an insulating substrate on which is formed a transistor that includes a poly-Si active layer, a gate insulating layer, and a gate, sequentially formed; forming an interconnection metal line at a predetermined distance from the gate; forming an insulating layer that covers the transistor and the interconnection metal line; forming an amorphous silicon layer on the insulating layer; forming a polycrystalline Si film crystallized in lateral directions on the insulating layer between the transistor and the interconnection metal line by annealing the amorphous silicon layer; and forming a transistor that includes a poly-Si active layer, a gate insulating layer, and a gate using the polycrystalline Si film.

The preparing of an insulating substrate on which a transistor is formed can include preparing an insulating substrate and forming a transistor that includes a poly-Si active layer, a gate insulating layer, and a gate, sequentially formed. The forming of the insulating layer that covers the transistor and the interconnection metal line can further include planarizing the insulating layer after forming the insulating layer. The amorphous silicon layer can be annealed using a laser beam. The insulating substrate can be a glass substrate or a plastic substrate, and the gate and the interconnection metal line can each be formed of a material having high thermal conductivity. The interconnection metal line can be formed of a metal selected from the group consisting of Al, Cr, Cu, and Mo, and the interconnection metal line can be formed parallel to the gate.

Example embodiments may provide an electronic device including a stacked transistor, including a substrate, a first transistor on the substrate and including a first active layer, a first gate, and a first gate insulating layer between the first active layer and the first gate, a first metal line spaced apart from the first gate on the substrate, a first insulating layer covering the first transistor and the first metal line and a second transistor on the first insulating layer between the first transistor and the first metal line, and including a second active layer, a second gate, and a second gate insulating layer between the second active layer and the second gate.

Example embodiments may provide an electronic device including a stacked transistor, including a substrate, a plurality of first transistors on the substrate, each of the first transistors including a first active layer, a first gate, and a first gate insulating layer between the first active layer and the first gate, a first insulating layer covering the plurality of first transistors, and a plurality of second transistors on the first insulating layer, each of the second transistors including a second active layer, a second gate, and a second gate insulating layer between the second active layer and the second gate. At least one of the second transistors is between two adjacent transistors of the plurality of first transistors.

BRIEF DESCRIPTION OF THE DRAWINGS

The above and other features and advantages of the present invention will be described in exemplary embodiments thereof with reference to the attached drawings in which.

DETAILED DESCRIPTION OF EXAMPLE EMBODIMENTS

Figure 1A:
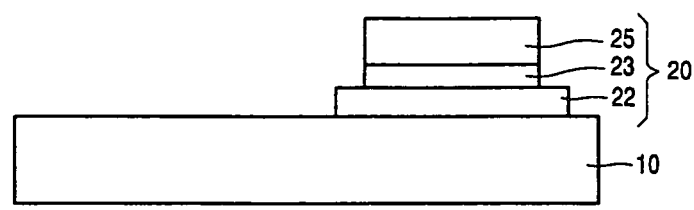
FIGS. 1A through 1F are cross-sectional views illustrating a method of manufacturing a polycrystalline Si film according to a first embodiment of the present invention.

A method of manufacturing a polycrystalline Si film and a method of manufacturing a stacked transistor according to the present invention will now be described with reference to the accompanying drawings, in which exemplary embodiments of the invention are shown. Like reference numerals refer to like elements throughout the drawings.

Figure 1B:
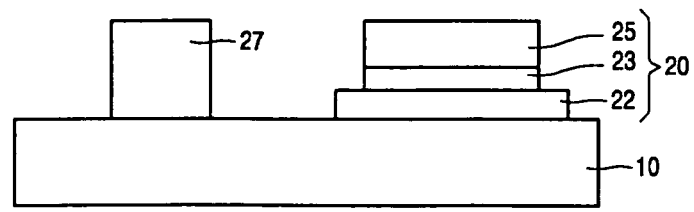
Figure 1C:
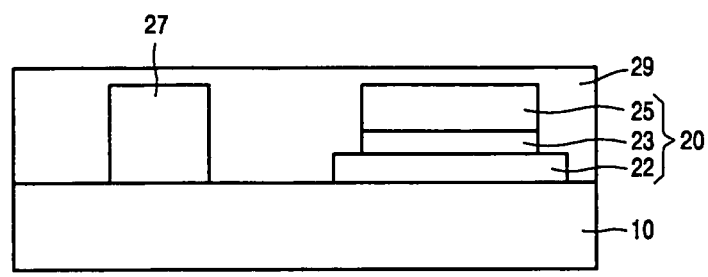
Figure 1D:
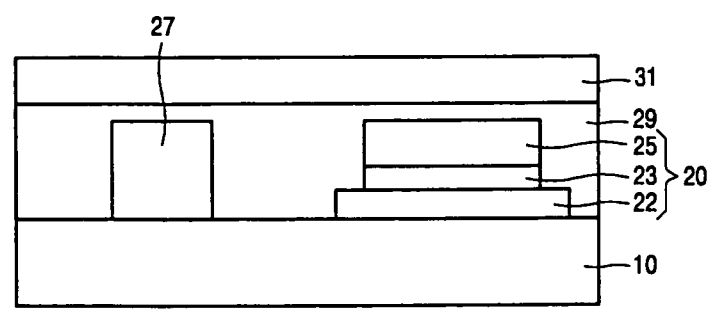
Figure 1E:
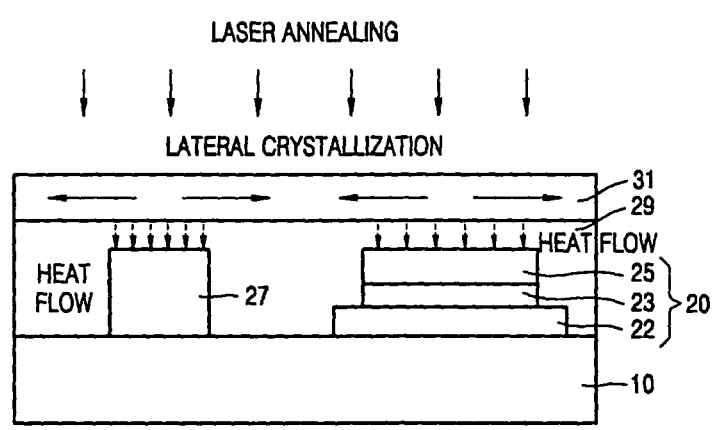
Figure 1F:
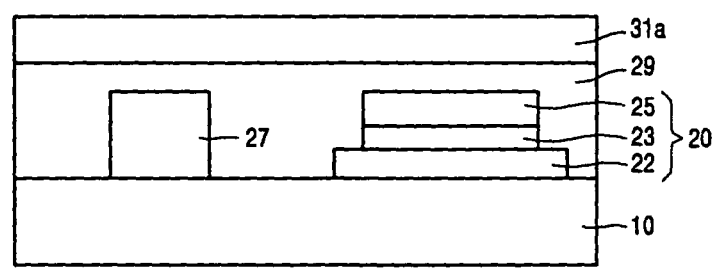
Figure 2:
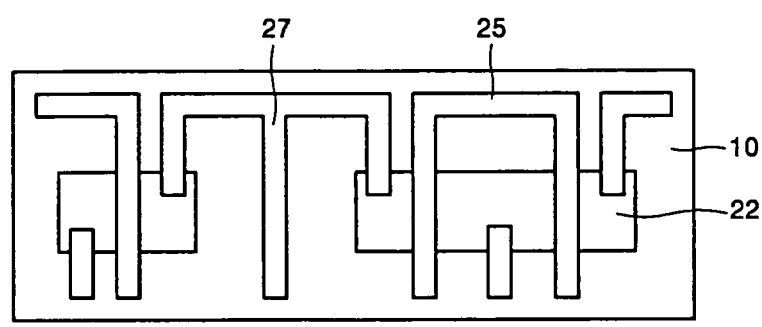
FIG. 2 is a plan view of FIG. 1B.

FIGS. 1A through 1F are cross-sectional views illustrating a method of manufacturing a polycrystalline Si film according to a first embodiment of the present invention, and FIG. 2 is a plan view of FIG. 1B.

Referring to FIG. 1A, an insulating substrate 10 is prepared. A transistor 20 that includes a poly-Si active layer 22, a gate insulating layer 23, and a gate 25 is formed on the insulating substrate 10 after preparation. The poly-Si active layer 22 includes a source and drain (not shown) and a channel (not shown) formed between the source and drain. Here, the insulating substrate 10 can be glass or plastic. Next, as depicted in FIG. 1B, an interconnection metal line 27 is formed at a predetermined distance from the gate 25. Here, the interconnection metal line 27 and the gate 25 are formed of a material having a high electric conductivity and an especially high thermal conductivity. The interconnection metal line 27 is formed of Al, Cr, Cu, or Mo. Al, Cr, Cu, and Mo are also metals for forming the gate 25. Therefore, the interconnection metal line 27 and the gate 25 can be formed at the same time in a single process of deposition and patterning. The interconnection metal line 27 is formed parallel to the gate 25.

Next, referring to FIGS. 1C and 1D, an insulating layer 29 is formed covering the transistor 20 and the interconnection metal line 27, and an amorphous silicon layer 31 is formed on the insulating layer 29. Here, a planarization process for planarizing the insulating layer 29 can further be performed prior to forming the amorphous silicon layer 31.

Next, referring to FIG. 1E, the amorphous silicon layer 31 is annealed using a laser such as an excimer laser. The amorphous silicon layer 31 absorbs the laser energy and is crystallized by repeating heating and cooling during the annealing process. At this time, since the gate 25 and the interconnection metal line 27 are formed of a material having high thermal conductivity, they absorb heat. Therefore, seed grains are generated on the transistor 20 and the interconnection metal line 27, and the seed grains can expand to laterals. In this manner, lateral crystallization of the amorphous silicon layer 31 can progress on the insulating layer 29 between the transistor 20 and the interconnection metal line 27.

Referring to FIG. 1F, a polycrystalline Si film 31a, crystallized in lateral directions, can be obtained on the insulating layer 29 between the transistor 20 and the interconnection metal line 27, by annealing the amorphous silicon layer 31.

Figure 3:
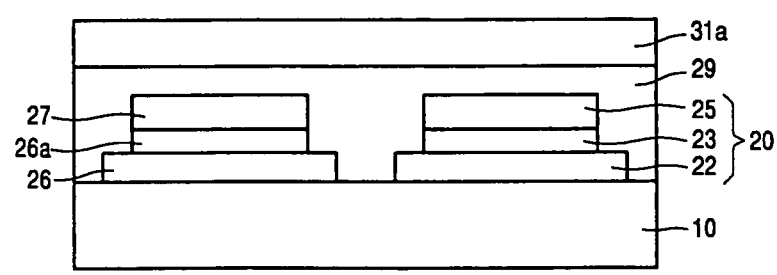
FIG. 3 is a cross-sectional view illustrating a method of manufacturing a polycrystalline Si film according to a second embodiment of the present invention.

FIG. 3 is a cross-sectional view illustrating a method of manufacturing a polycrystalline Si film according to a second embodiment of the present invention.

The method of manufacturing a polycrystalline Si film according to the second embodiment is similar to that of the first embodiment, except that in the second embodiment, a poly-Si active layer 26 and a gate insulating layer 26a are further included between the insulating substrate 10 and the interconnection metal line 27. Here, the interconnection metal line 27 acts as a gate electrode.

The polycrystalline Si film is readily obtained by the methods according to the present invention, and the polycrystalline Si film has high mobility since it has very few grain boundaries.

The method of manufacturing the polycrystalline Si film can be directly applied to manufacturing a stacked transistor for a stacked static random access memory (SRAM) device. The method of manufacturing a stacked transistor for a stacked SRAM device will now be described.

Figure 4A:
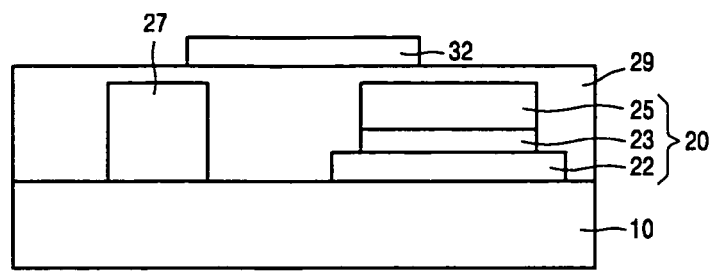
FIGS. 4A through 4C are cross-sectional views illustrating a method of manufacturing a stacked transistor according to the first embodiment, using the polycrystalline Si film of FIG. 1F.
Figure 4B:
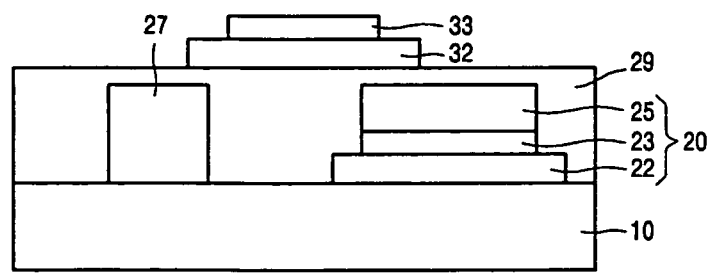
Figure 4C:
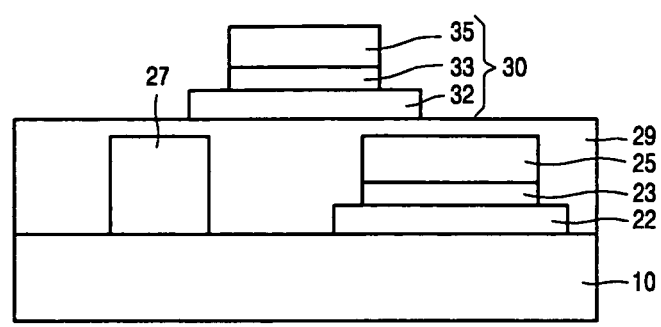

FIGS. 4A through 4C are cross-sectional views illustrating a method of manufacturing a stacked transistor according to the first embodiment of the present invention, using the polycrystalline Si film of FIG. 1F.

Referring to FIGS. 4A through 4C, a poly-Si active layer 32 is formed by patterning the polycrystalline Si film 31a depicted in FIG. 1F to a predetermined width. The poly-Si active layer 32 includes a source and drain (not shown) and a channel (not shown) between the source and drain.

Next, a gate insulating layer 33 and a gate 35 are sequentially formed on the poly-Si active layer 32. In this manner, a stacked structure of an upper transistor 30 on a lower transistor 20 can be manufactured. Here, the interconnection metal line 27 is a conductive line that connects the stacked transistor devices to each other. A semiconductor memory device, such as an SRAM device, can be manufactured when the transistor devices are connected by the interconnection metal line 27.

Figure 5:
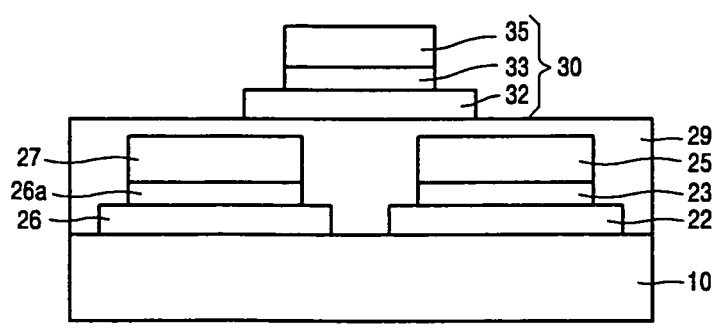
FIG. 5 is a cross-sectional view illustrating a method of manufacturing a stacked transistor according to the second embodiment, using the polycrystalline Si film of FIG. 3.

FIG. 5 is a cross-sectional view illustrating a method of manufacturing a stacked transistor according to the second embodiment of the present invention, using the polycrystalline Si film of FIG. 3.

The method of manufacturing a stacked transistor according to the second embodiment is similar to that of the first embodiment, except that in the second embodiment, a poly-Si active layer 26 and a gate insulating layer 26a are further formed between the insulating substrate 10 and the interconnection metal line 27. Here, the interconnection metal line 27 acts as a gate electrode.

Figure 6:
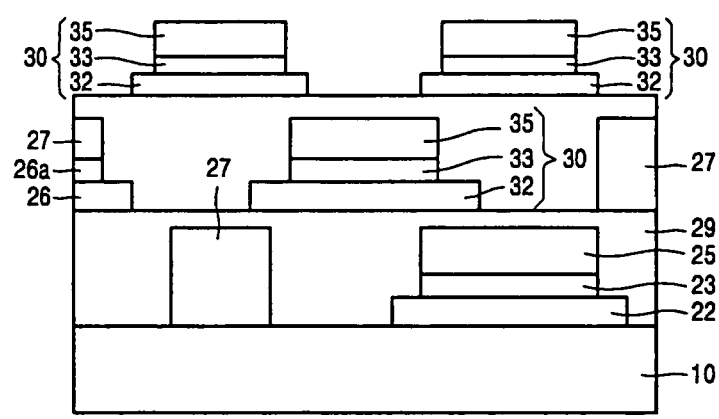
FIG. 6 is a cross-sectional view illustrating a method of manufacturing a stacked transistor according to a third embodiment of the present invention, using the methods of manufacturing the polycrystalline Si film according to the first and second embodiments of the present invention.

FIG. 6 is a cross-sectional view illustrating a method of manufacturing a stacked transistor according to a third embodiment of the present invention, using the methods of manufacturing the polycrystalline Si film according to the first and second embodiments.

According to the present invention, the process for manufacturing the polycrystalline Si film is simple, thereby reducing the manufacturing cost. Also, a high quality polycrystalline Si film can be formed on a glass or plastic substrate which is sensitive to high temperatures. Also, the method of manufacturing a polycrystalline Si film can be directly applied to the manufacture of a stacked transistor used for a stacked SRAM device. The method of manufacturing a stacked transistor can simplify the manufacturing process, thereby reducing cost.

The methods of manufacturing a polycrystalline Si film according to the present invention are especially suited for the manufacture of flat display devices, such as AMLCDs and AMOLEDs, solar cells, and any semiconductor memory devices that use a plastic substrate. The polycrystalline Si film is especially useful for TFTs that require high mobility and speedy response, and TFTs that use a plastic substrate. The TFTs can be applied to any electronic device that uses TFTs as a switching device or an amplifying device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An electronic device including a stacked transistor, comprising:
    a substrate;
    a first transistor on the substrate and including a first active layer, a first gate, and a first gate insulating layer between the first active layer and the first gate;
    a first metal line spaced apart from the first gate on the substrate;
    a first insulating layer covering the first transistor and the first metal line; and
    a second transistor on the first insulating layer between the first transistor and the first metal line, and including a second active layer, a second gate, and a second gate insulating layer between the second active layer and the second gate, wherein
        the first metal line is separated from and electrically insulated from the second transistor,
        the substrate is one of a glass substrate and a plastic substrate, and
        at least the first active layer of the first and second active layers is a poly-Si layer.

2. The electronic device of claim 1, wherein the first metal line includes at least one of Al, Cr, Cu and Mo.

3. The electronic device of claim 1, wherein at least a portion of the first metal line is parallel to the first gate.

4. The electronic device of claim 1, wherein the first transistor is a plurality of first transistors,
    the first metal line is a gate of at least one of the plurality of first transistors, and
    the second transistor is on the first insulating layer between two adjacent transistors of the plurality of first transistors.

5. The electronic device of claim 1, wherein the first transistor is a plurality of first transistors, and
    the first metal line is an interconnection line for connecting two adjacent transistors of the plurality of first transistors.

6. The electronic device of claim 1, further comprising:
    a second metal line spaced apart from the second gate on the first insulating layer;
    a second insulating layer covering the second transistor and the second metal line; and
    a third transistor on the second insulating layer between the second transistor and the second metal line, and including a third active layer, a third gate, and a third gate insulating layer between the third active layer and the third gate.

7. The electronic device of claim 6, wherein the first transistor is a plurality of first transistors,
    the first metal line is a gate of at least one of the plurality of first transistors, and
    the second transistor is on the first insulating layer between two adjacent transistors of the plurality of first transistors.

8. The electronic device of claim 7, wherein the second transistor is a plurality of second transistors,
    the second metal line is a gate of at least one of the plurality of second transistors, and
    the third transistor is formed on the second insulating layer between two adjacent transistors of the plurality of second transistors.

9. The electronic device of claim 6, wherein the second transistor is a plurality of second transistors, and
    the second metal line is an interconnection line for connecting two adjacent transistors of the plurality of second transistors.

10. The electronic device of claim 6, wherein the second metal line includes at least one of Al, Cr, Cu and Mo.

11. The electronic device of claim 6, wherein at least a portion of the second metal line is parallel to the second gate.

12. The electronic device of claim 6, wherein the third active layer is a poly-Si layer.

13. The electronic device of claim 1, wherein the electronic device is a static random access memory (SRAM) device.

14. An electronic device including a stacked transistor, comprising:
    a substrate;
    a plurality of first transistors on the substrate, each of the first transistors including a first active layer, a first gate, and a first gate insulating layer between the first active layer and the first gate;
    a first insulating layer covering the plurality of first transistors; and
    a plurality of second transistors on the first insulating layer, each of the second transistors including a second active layer, a second gate, and a second gate insulating layer between the second active layer and the second gate, wherein
        at least one of the second transistors is between two adjacent transistors of the plurality of first transistors,
        the substrate is one of a glass substrate and a plastic substrate, and
        at least the first active layer of the first and second active layers is a poly-Si layer.

15. The electronic device of claim 14, further comprising:
    a second insulating layer covering the plurality of second transistors; and
    a plurality of third transistors on the second insulating layer, each of the third transistors including a third active layer, a third gate, and a third gate insulating layer between the third active layer and the third gate,
    wherein at least one of the third transistors is between two adjacent transistors of the plurality of second transistors.

16. An electronic device including a stacked transistor, comprising:
    a substrate;
    a first transistor on the substrate and including a first active layer, a first gate, and a first gate insulating layer between the first active layer and the first gate;
    a first metal line spaced apart from the first gate on the substrate;
    a first insulating layer covering the first transistor and the first metal line; and a second transistor on the first insulating layer between the first transistor and the first metal line, and including a second active layer, a second gate, and a second gate insulating layer between the second active layer and the second gate, wherein
  the first transistor is a plurality of first transistors, the first metal line is a gate of at least one of the plurality of first transistors, and the second transistor is on the first insulating layer between two adjacent transistors of the plurality of first transistors,
  the substrate is one of a glass substrate and a plastic substrate, and
  at least the first active layer of the first and second active layers is a poly-Si layer.

17. An electronic device including a stacked transistor, comprising:
  a substrate;
  a first transistor on the substrate and including a first active layer, a first gate, and a first gate insulating layer between the first active layer and the first gate;
  a first metal line spaced apart from the first gate on the substrate;
  a first insulating layer covering the first transistor and the first metal line;
  a second transistor on the first insulating layer between the first transistor and the first metal line, and including a second active layer, a second gate, and a second gate insulating layer between the second active layer and the second gate;
  a second metal line spaced apart from the second gate on the first insulating layer;
  a second insulating layer covering the second transistor and the second metal line; and
  a third transistor on the second insulating layer between the second transistor and the second metal line, and including a third active layer, a third gate, and a third gate insulating layer between the third active layer and the third gate, wherein
  the first metal line is separated from and electrically insulated from the second transistor,
  the first transistor, the second transistor, and the third transistor are offset from one another in a first direction such that the first, second, and third transistors are substantially diagonal to one another.

* * * * *